US010037961B2

(12) United States Patent
Chiu et al.

(10) Patent No.: US 10,037,961 B2
(45) Date of Patent: Jul. 31, 2018

(54) INTEGRATED FAN-OUT PACKAGE AND METHOD OF FABRICATING THE SAME

(71) Applicant: Taiwan Semiconductor Manufacturing Co., Ltd., Hsinchu (TW)

(72) Inventors: Ming-Yen Chiu, Hsinchu County (TW); Ching-Fu Chang, Taipei (TW); Hsin-Chieh Huang, Hsin-Chu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/156,339

(22) Filed: May 17, 2016

(65) Prior Publication Data

US 2017/0338196 A1 Nov. 23, 2017

(51) Int. Cl.
*H01L 23/00* (2006.01)
*H01L 23/48* (2006.01)
(Continued)

(52) U.S. Cl.
CPC ........ *H01L 24/14* (2013.01); *H01L 21/31053* (2013.01); *H01L 21/568* (2013.01); *H01L 21/6835* (2013.01); *H01L 21/76885* (2013.01); *H01L 21/78* (2013.01); *H01L 23/3107* (2013.01); *H01L 23/481* (2013.01); *H01L 23/544* (2013.01); *H01L 24/06* (2013.01); *H01L 25/0657* (2013.01); *H01L 2221/68327* (2013.01); *H01L 2221/68359* (2013.01); *H01L 2224/0231* (2013.01); *H01L 2224/0237* (2013.01);
(Continued)

(58) Field of Classification Search
CPC ... H01L 24/06; H01L 24/14; H01L 21/31053; H01L 21/568; H01L 21/6835; H01L 21/76885; H01L 23/3107
See application file for complete search history.

(56) References Cited

U.S. PATENT DOCUMENTS

2012/0175732 A1* 7/2012 Lin ................... H01L 23/49816
257/531
2013/0062108 A1* 3/2013 Kondo ................ H05K 3/4069
174/258

(Continued)

*Primary Examiner* — Christine Enad
(74) *Attorney, Agent, or Firm* — JCIPRNET

(57) ABSTRACT

An integrated fan-out package including an integrated circuit, an insulating encapsulation, a plurality of conductive through vias, and a redistribution circuit structure is provided. The integrated circuit includes a plurality of conductive terminals. The insulating encapsulation encapsulates sidewalls of the integrated circuit. The conductive through vias penetrate in the insulating encapsulation. The redistribution circuit structure is disposed on the integrated circuit, the conductive through vias and the insulating encapsulation. The redistribution conductive layer is electrically connected to the conductive terminals and the conductive through vias. A plurality of first contact surfaces of the conductive terminals and a plurality of second contact surfaces of the conductive through vias are in contact with the redistribution circuit structure, and a roughness of the first contact surfaces and the second contact surfaces ranges from 100 angstroms to 500 angstroms. Methods of fabricating the integrated fan-out package are also provided.

20 Claims, 12 Drawing Sheets

(51) Int. Cl.

| | |
|---|---|
| *H01L 23/544* | (2006.01) |
| *H01L 23/31* | (2006.01) |
| *H01L 21/768* | (2006.01) |
| *H01L 21/56* | (2006.01) |
| *H01L 21/3105* | (2006.01) |
| *H01L 21/683* | (2006.01) |
| *H01L 25/065* | (2006.01) |
| *H01L 21/78* | (2006.01) |

(52) U.S. Cl.
CPC ............... *H01L 2224/0401* (2013.01); *H01L 2224/05124* (2013.01); *H01L 2224/05147* (2013.01); *H01L 2224/13014* (2013.01); *H01L 2224/13016* (2013.01); *H01L 2224/13023* (2013.01); *H01L 2224/13024* (2013.01); *H01L 2224/13025* (2013.01); *H01L 2224/13147* (2013.01); *H01L 2224/16145* (2013.01); *H01L 2224/16225* (2013.01); *H01L 2225/06513* (2013.01); *H01L 2225/06517* (2013.01); *H01L 2225/06548* (2013.01); *H01L 2924/059* (2013.01); *H01L 2924/05042* (2013.01); *H01L 2924/05442* (2013.01); *H01L 2924/06* (2013.01); *H01L 2924/07025* (2013.01); *H01L 2924/14* (2013.01)

(56) References Cited

U.S. PATENT DOCUMENTS

| | | | |
|---|---|---|---|
| 2013/0134581 A1* | 5/2013 | Lin | H01L 21/563 257/737 |
| 2014/0131858 A1* | 5/2014 | Pan | H01L 24/19 257/737 |
| 2015/0258769 A1* | 9/2015 | Farah | C30B 29/42 156/711 |
| 2016/0126150 A1* | 5/2016 | Goldberg | H01L 22/12 438/8 |
| 2017/0033026 A1* | 2/2017 | Ho | H01L 21/56 |
| 2017/0084570 A1* | 3/2017 | Wickramanayaka | H01L 25/50 |

* cited by examiner

INTEGRATED FAN-OUT PACKAGE AND METHOD OF FABRICATING THE SAME

BACKGROUND

The semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more of the smaller components to be integrated into a given area. These smaller electronic components also require smaller packages that utilize less area than previous packages. Some smaller types of packages for semiconductor components include quad flat packages (QFPs), pin grid array (PGA) packages, ball grid array (BGA) packages, and so on.

Currently, integrated fan-out packages are becoming increasingly popular for their compactness. In the integrated fan-out packages, reliability of the redistribution circuit structure fabricated on the molding compound is highly concerned during IC packaging process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
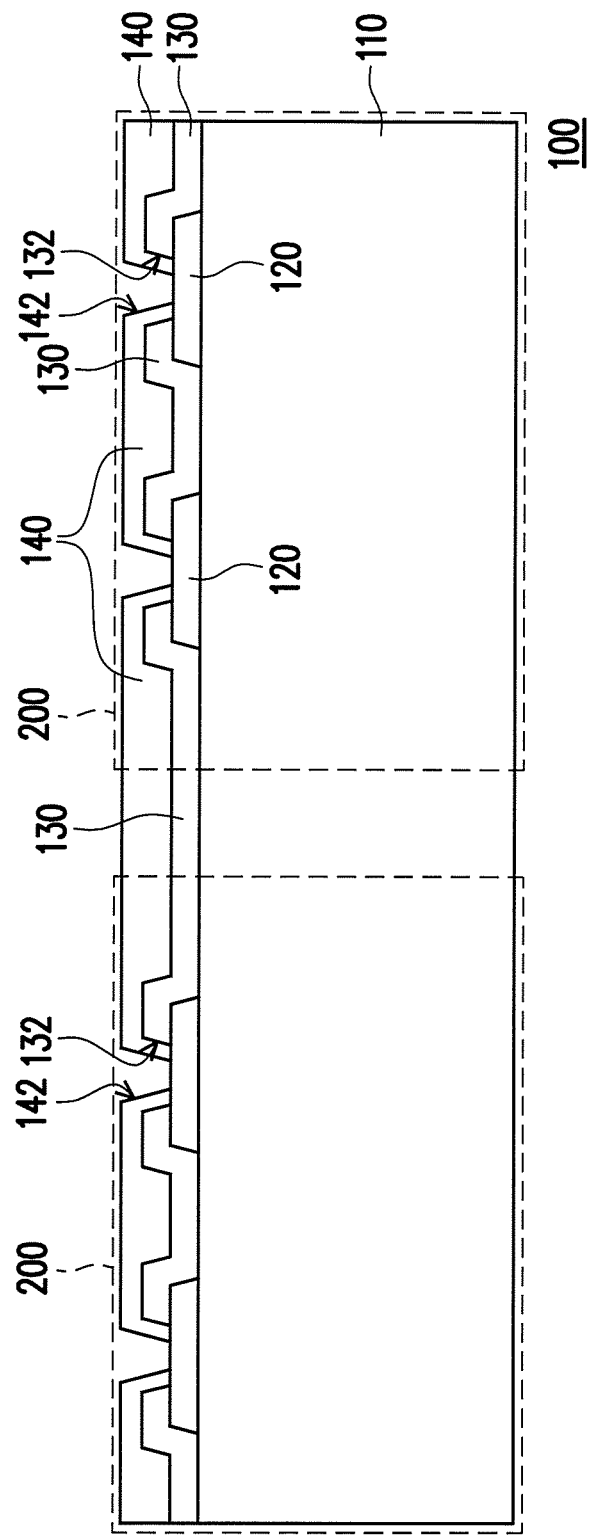
FIGS. 1 through 11 illustrate a process flow for fabricating an integrated fan-out package in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 10:
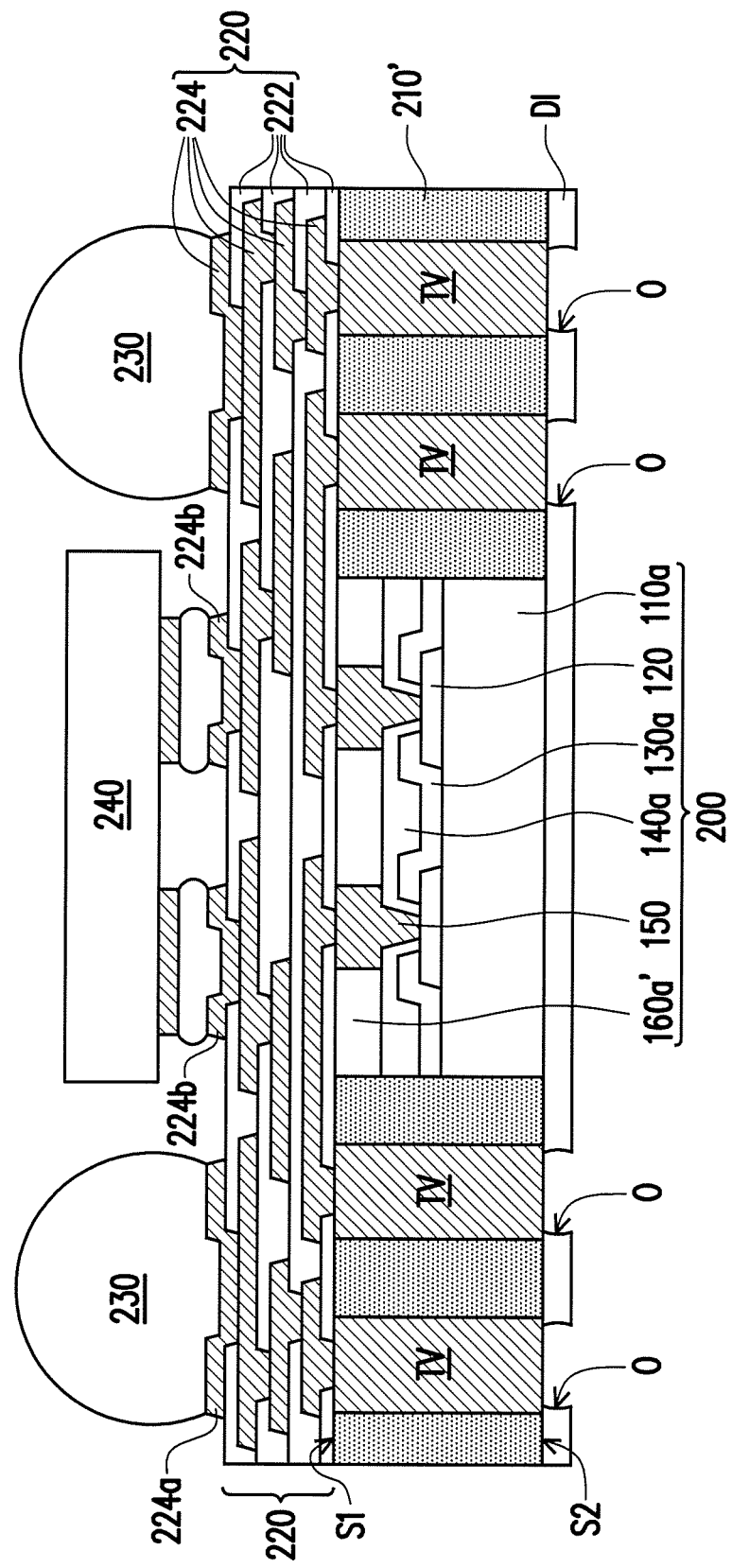
Figure 11:
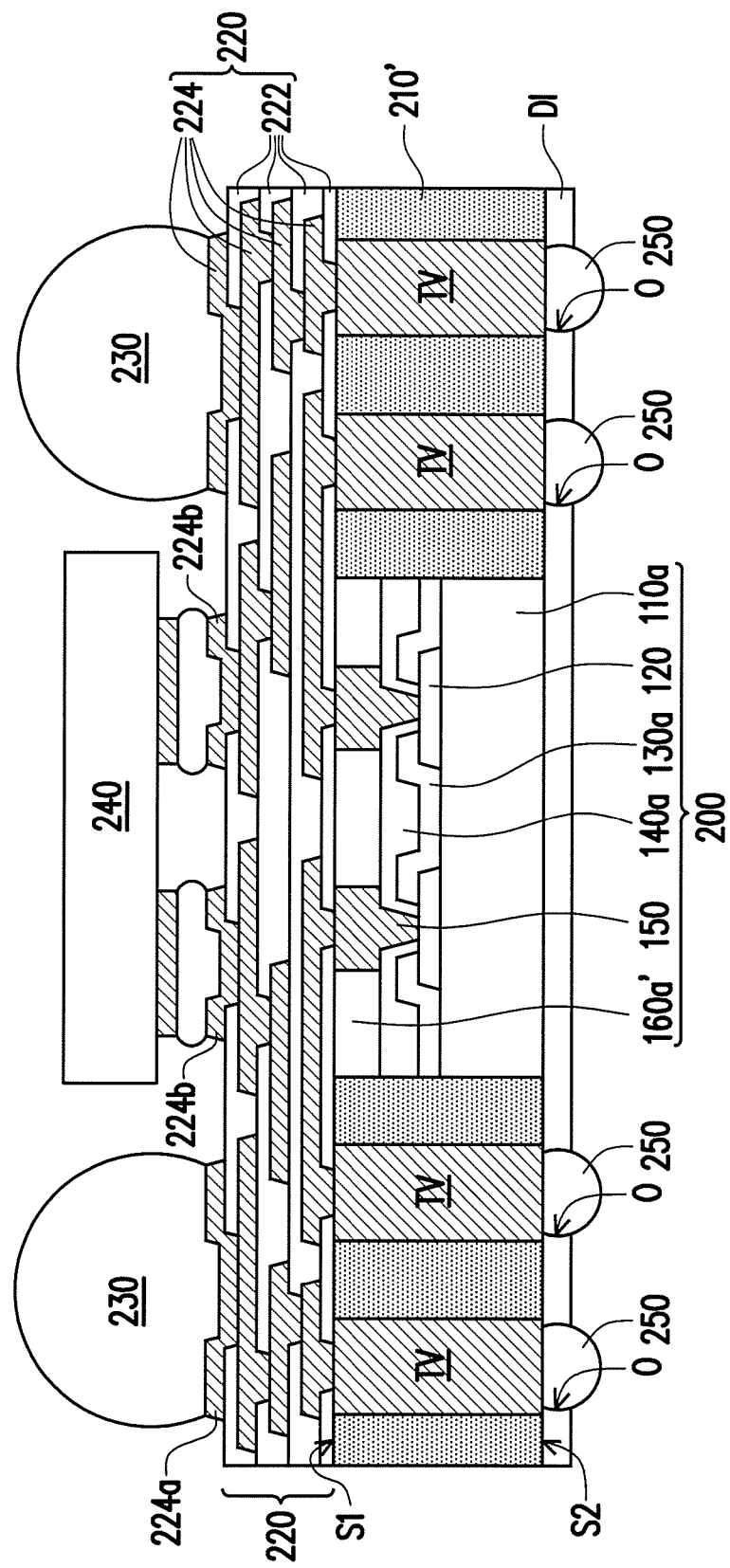
Figure 12:
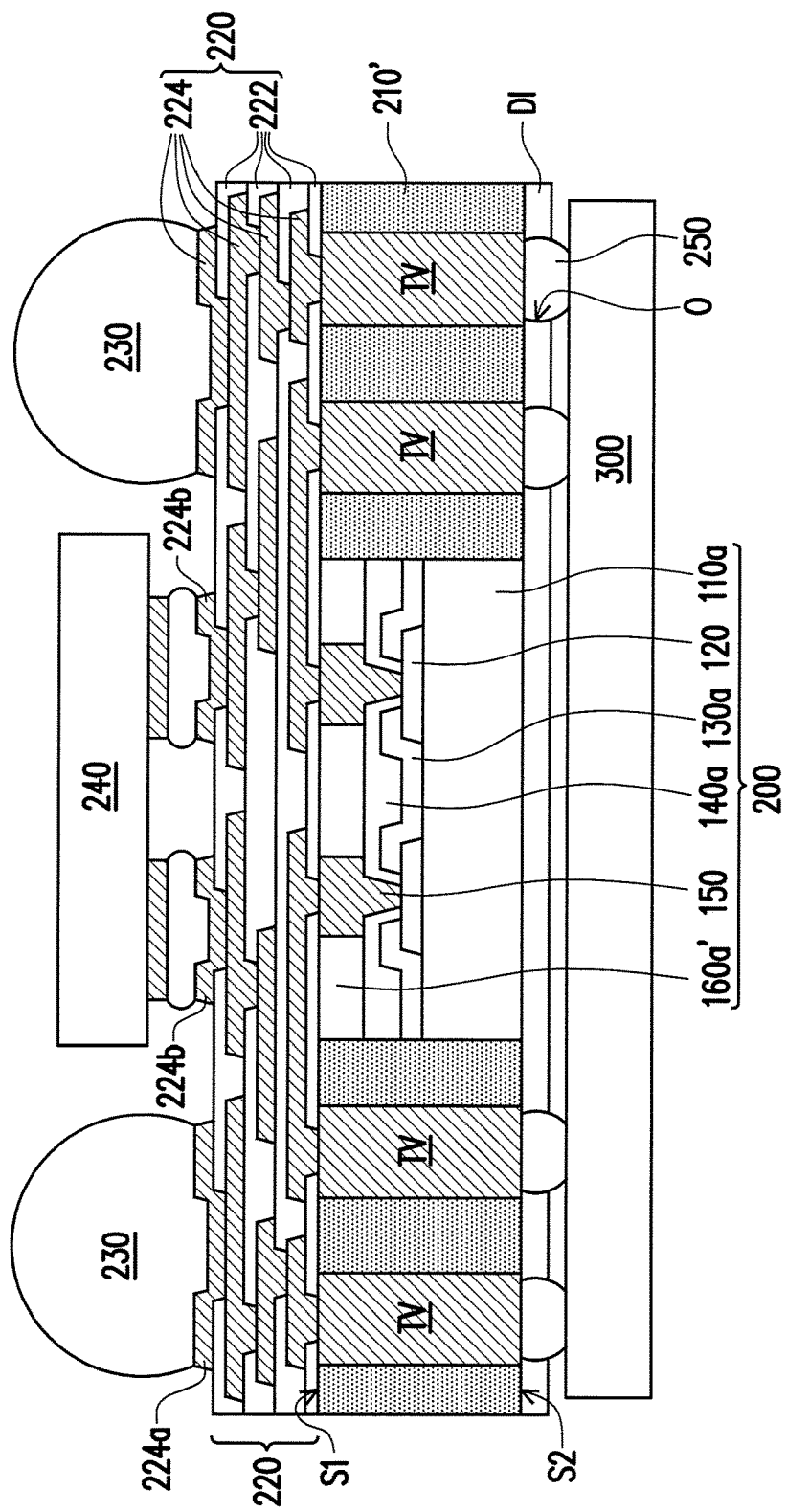
FIG. 12 is a cross-sectional view illustrating a package-on-package (POP) structure in accordance with some embodiments.

FIGS. 1 through 11 illustrate a process flow for fabricating an integrated fan-out package in accordance with some embodiments, and FIG. 12 is a cross-sectional view illustrating a package-on-package (POP) structure in accordance with some embodiments.

Referring to FIG. 1, a wafer 100 including a plurality of dies or integrated circuits 200 arranged in an array is provided. Before a wafer dicing process is performed on the wafer 100, the integrated circuits 200 of the wafer 100 are connected one another. In some embodiments, the wafer 100 includes a semiconductor substrate 110, a plurality of conductive pads 120 formed on the semiconductor substrate 110, and a passivation layer 130. The passivation layer 130 is formed over the substrate 110 and has a plurality of contact opening 132 so as to partially cover the conductive pads 120. In other words, the conductive pads 120 on the substrate 110 are partially exposed by the contact openings 132 of the passivation layer 130. For example, the semiconductor substrate 110 may be a silicon substrate including active components (e.g., transistors or the like) and passive components (e.g., resistors, capacitors, inductors or the like) formed therein; the conductive pads 120 may be aluminum pads, copper pads or other suitable metal pads; and the passivation layer 130 may be a silicon oxide layer, a silicon nitride layer, a silicon oxy-nitride layer or a dielectric layer formed by other suitable dielectric materials.

As shown in FIG. 1, in some embodiments, the wafer 100 may further include a post-passivation layer 140 formed over the passivation layer 130. The post-passivation layer 140 covers the passivation layer 130 and has a plurality of contact opening 142. The conductive pads 120 exposed by the contact opening 132 of the passivation 130 is partially covered by the post passivation layer 140. In other words, the conductive pads 120 are partially exposed by the contact opening 142 of the post passivation layer 140. For example, the post-passivation layer 140 may be a polyimide (PI) layer, a polybenzoxazole (PBO) layer, or a dielectric layer formed by other suitable polymers.

Figure 2:
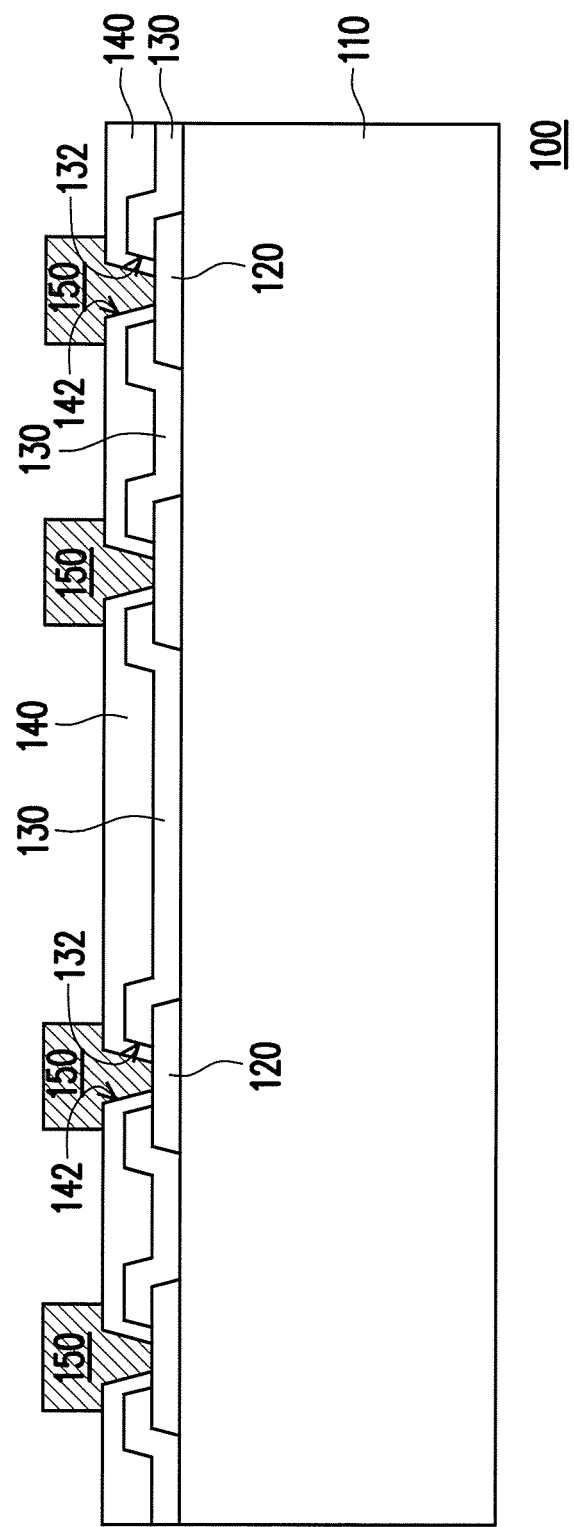

Referring to FIG. 2, a plurality of conductive pillars or conductive vias 150 are formed on the conductive pads 120. In some embodiments, the conductive pillars or conductive vias 150 are plated on the conductive pads 120. For example, firstly, a seed layer is sputtered onto the post-passivation layer 140 and the conductive pads 120 exposed by the contact opening 142; a patterned photoresist layer (not shown) for exposing the conductive pads 120 is formed over the seed layer by photolithography; the wafer 100 including the patterned photoresist layer formed thereon is then immersed into a plating solution such that the conductive pillars or conductive vias 150 are plated on the seed layer that is corresponding to the conductive pads 120. After the plated conductive pillars or conductive vias 150 are formed, the patterned photoresist layer is stripped. Thereafter, by using the conductive pillars or conductive vias 150 as a hard mask, portions of the seed layer that are not covered by the conductive pillars or conductive vias 150 are removed through etching until the post passivation layer 140 is exposed, for example.

In some embodiments, the conductive pillars or conductive vias 150 are copper pillars or copper vias.

Figure 3:
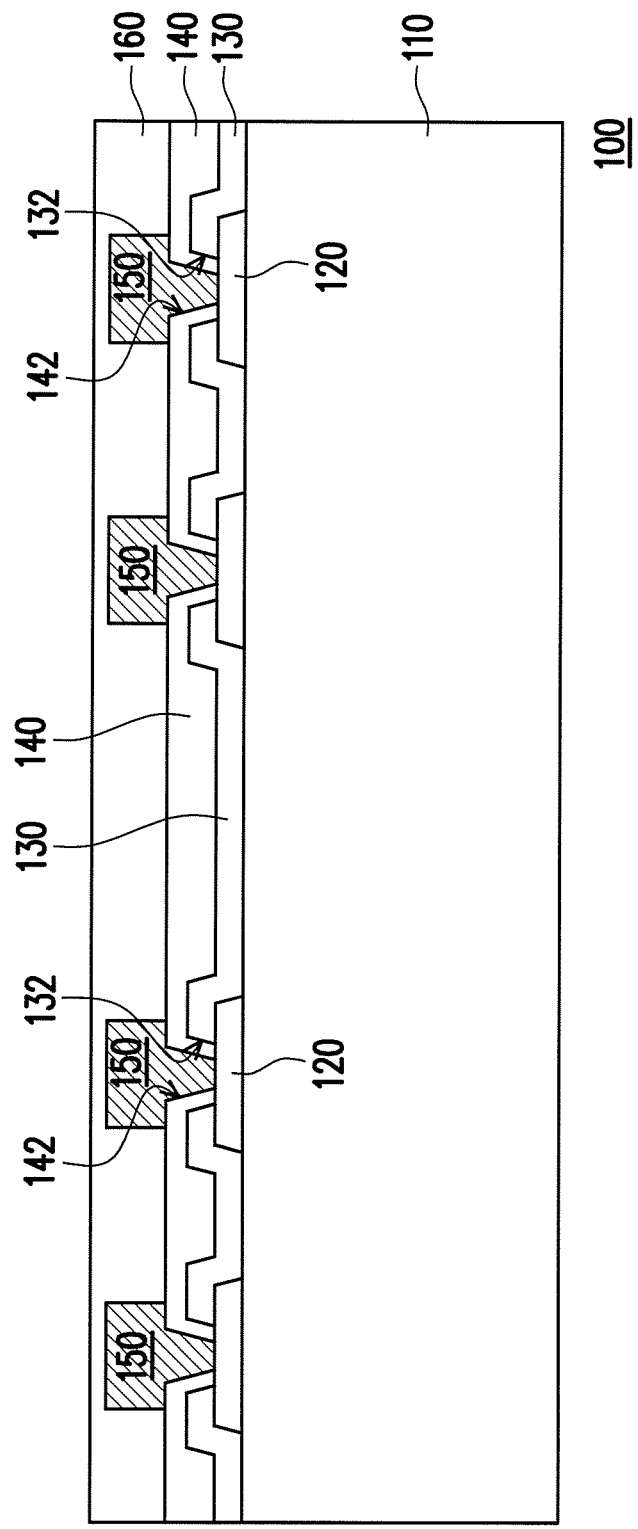

Referring to FIG. 3, after the conductive pillars or conductive vias 150 are formed, a protection layer 160 is formed on the post passivation layer 140 so as to cover the conductive pillars or conductive vias 150. In some embodiments, the protection layer 160 may be a polymer layer having sufficient thickness to encapsulate and protect the conductive pillars or conductive vias 150. For example, the protection layer 160 may be a polybenzoxazole (PBO) layer, a polyimide (PI) layer or other suitable polymers. In some alternative embodiments, the protection layer 160 may be made of inorganic materials.

Figure 4:
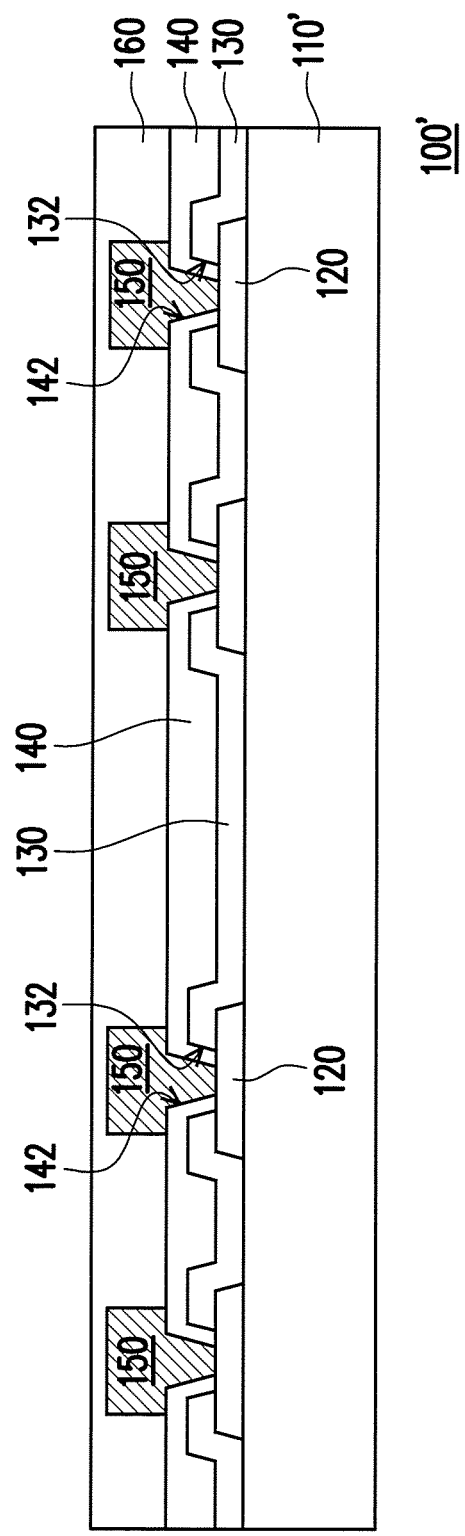

Referring to FIG. 4, a back side grinding process is performed on the rear surface of the wafer 100 after the protection layer 160 is formed. During the back side grinding process, the semiconductor substrate 110 is grinded such that a thinned wafer 100' including a semiconductor substrate 110' is formed.

Figure 5:
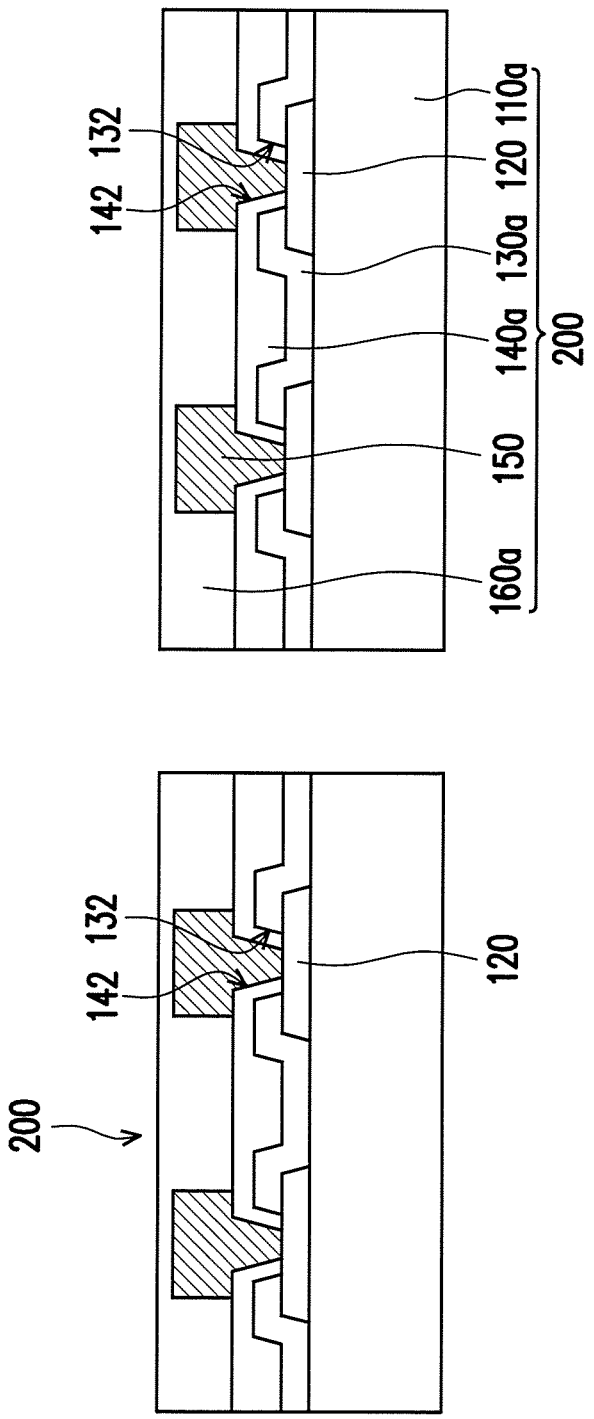

Referring to FIG. 5, after the back side grinding process is performed, a wafer dicing process is performed on the thinned wafer 100' such that the integrated circuits 200 of the wafer 100 are singulated from one another. As shown in FIG. 5, the singulated integrated circuits 200 each includes a semiconductor substrate 110a, the conductive pads 120 formed on the semiconductor substrate 110a, a passivation layer 130a, a post passivation layer 140a, the conductive pillars or conductive vias 150, and a protection layer 160a. The conductive pads 120 and the conductive vias 150 electrically connected thereto may be interpreted as conductive terminals of the integrated circuits 200. The materials of the semiconductor substrate 110a, the passivation layer 130a, the post passivation layer 140a, and the protection layer 160a are similar with those of the semiconductor substrate 100, the passivation layer 130, the post passivation layer 140, and the protection layer 160. Thus, the detailed descriptions of the semiconductor substrate 110a, the passivation layer 130a, the post passivation layer 140a, and the protection layer 160a are omitted.

As shown in FIG. 4 and FIG. 5, during the back side grinding and the wafer dicing processes, the protection layer 160 and 160a may well protect the conductive terminals (e.g., the conductive pads 120 and the conductive vias 150) of the integrated circuits 200. In addition, the conductive pads 120 and the conductive vias 150 of the integrated circuits 200 may be protected from being damaged by sequentially performed processes, such as the pick-up and placing process of the integrated circuits 200, the molding process, and so on.

Figure 6:
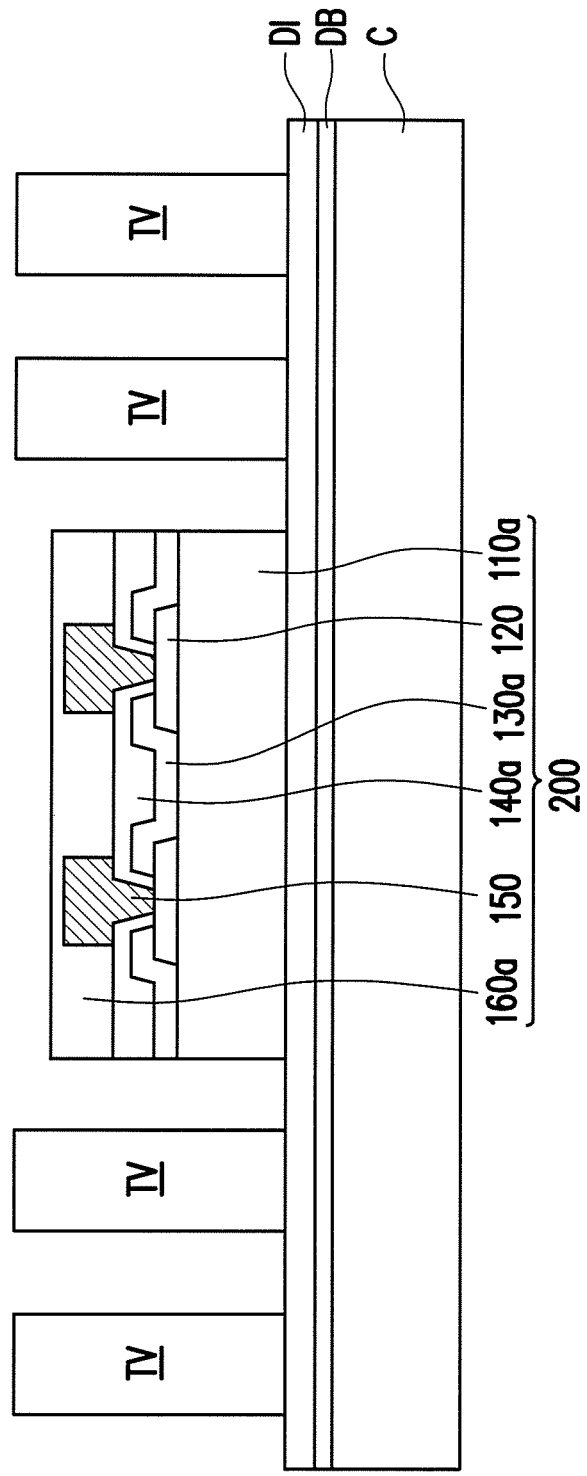

Referring to FIG. 6, after the integrated circuits 200 are singulated from the thinned wafer 100', a carrier C having a de-bonding layer DB and a dielectric layer DI formed thereon is provided, wherein the de-bonding layer DB is between the carrier C and the dielectric layer DI. In some embodiments, the carrier C is a glass substrate, the de-bonding layer DB is a light-to-heat conversion (LTHC) release layer formed on the glass substrate, and the dielectric layer DI is a polybenzoxazole (PBO) layer formed on the de-bonding layer DB, for example.

After the carrier C having the de-bonding layer DB and the dielectric layer DI formed thereon is provided, a plurality of conductive through vias TV are formed on the dielectric layer DI. In some embodiments, the plurality of conductive through vias TV is formed by photolithography, plating, and photoresist stripping process. For example, the conductive through vias TV include copper posts.

As shown in FIG. 6, in some embodiments, one of the integrated circuits 200 including the conductive terminals (e.g. the conductive pads 120 and the conductive vias 150) and a protection layer 160a formed thereon may be picked and placed on the dielectric layer DI. The integrated circuits 200 is attached or adhered on the dielectric layer DI through a die attach film, a adhesion paste or the like. In some alternative embodiments, more than one of the integrated circuits 200 may be picked and placed on the dielectric layer DI, wherein the integrated circuits 200 placed on the dielectric layer DI may be arranged in an array. When the integrated circuits 200 placed on the dielectric layer DI are arranged in an array, the conductive through vias TV may be classified into groups. The number of the integrated circuits 200 is corresponding to the number of the groups of the conductive through vias TV.

As shown in FIG. 6, the top surface of the protection layer 160a is lower than the top surfaces of the conductive through vias TV, and the top surface of the protection layer 160a is higher than the top surfaces of the conductive pillars or conductive vias 150, for example. However, the disclosure is not limited thereto. In some alternative embodiments, the top surface of the protection layer 160a may be substantially aligned with the top surfaces of the conductive through vias TV, and the top surface of the protection layer 160a is higher than the top surfaces of the conductive pillars or conductive vias 150.

As shown in FIG. 6, one or more of the integrated circuits 200 may be picked and placed on the dielectric layer DI after the formation of the conductive through vias TV. However, the disclosure is not limited thereto. In some alternative embodiments, one or more of the integrated circuits 200 may be picked and placed on the dielectric layer DI before the formation of the conductive through vias TV.

Figure 7:
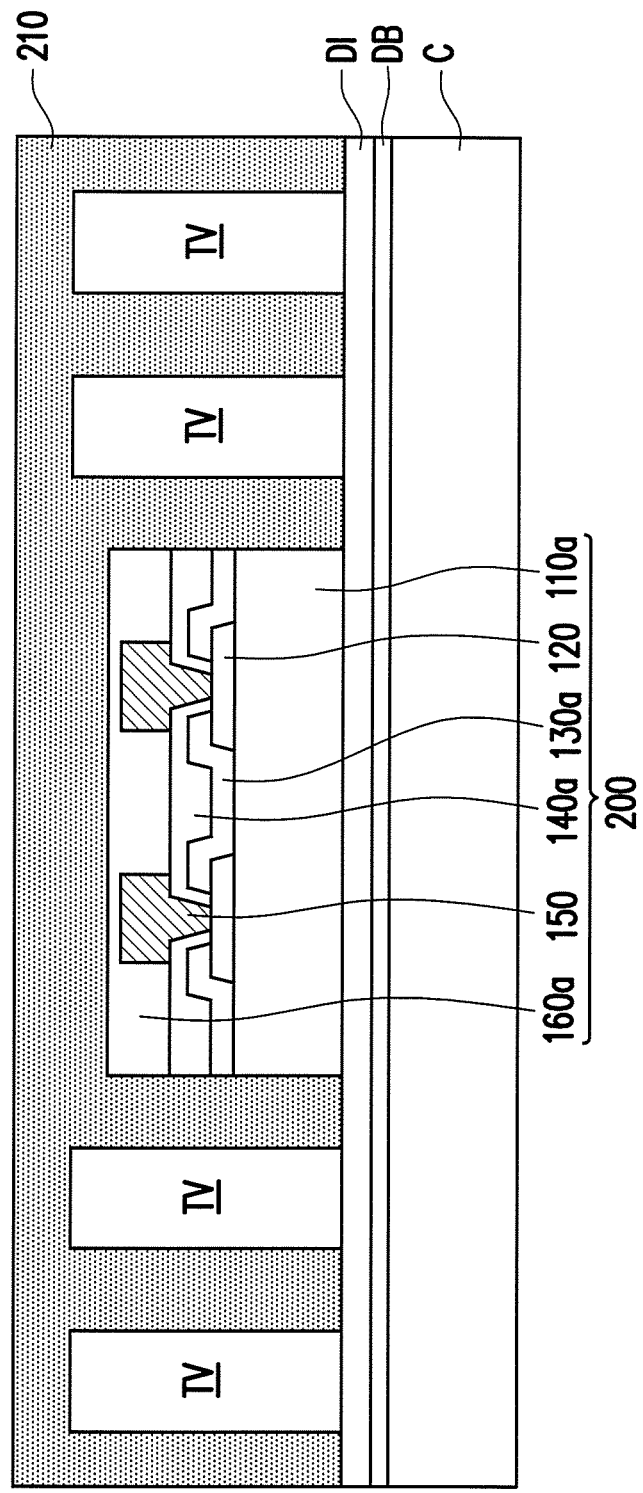

Referring to FIG. 7, an insulating material 210 is formed on the dielectric layer DI to cover the integrated circuit 200 and the conductive through vias TV. In some embodiments, the insulating material 210 is a molding compound formed by molding process. The conductive pillars or conductive vias 150 and the protection layer 160a of the integrated circuit 200 are covered by the insulating material 210. In other words, the conductive pillars or conductive vias 150 and the protection layer 160a of the integrated circuit 200 are not revealed and are well protected by the insulating material 210 during the formation of the insulating material 210. In some embodiments, the insulating material 210 includes epoxy or other suitable resins.

Figure 8:
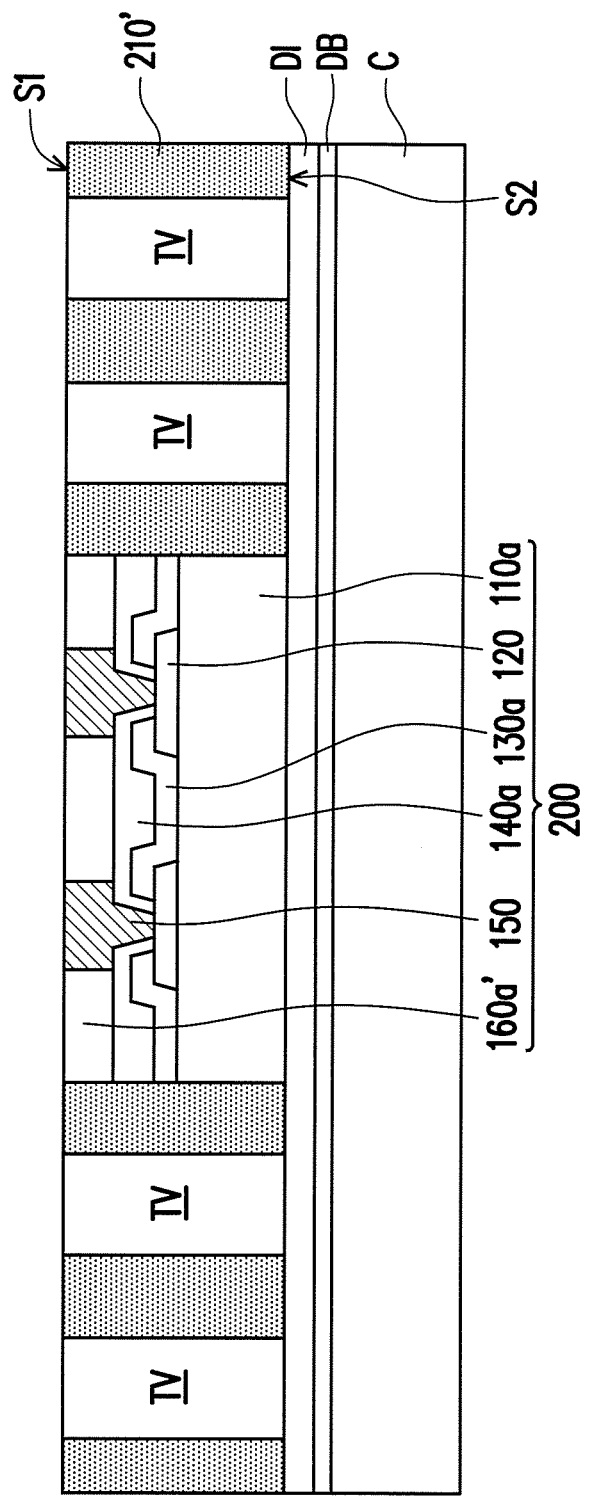

Referring to FIG. 8, the insulating material 210 is then mechanically grinded until the first contact surfaces (e.g. the top surfaces) of the conductive pillars or conductive vias 150 (i.e. conductive terminals), the second contact surfaces (e.g. the top surfaces) of the conductive through vias TV, and the top surface of the protection layer 160a are exposed. After the insulating material 210 is mechanically grinded, an insulating encapsulation 210' is formed over the dielectric layer DI, and the roughness (Ra, roughness average) of the first contact surfaces of the conductive vias 150 and the second contact surface of the conductive through vias TV ranges from 100 angstroms to 500 angstroms. In some embodiments, the roughness of the first contact surfaces of the conductive vias 150 and the second contact surface of the conductive through vias TV ranges from 250 angstroms to 400 angstrom, for example, 300 angstroms. In some embodiments, after the insulating material 210 is mechanically grinded, a plurality of grinding marks are formed on the first contact surfaces of the conductive vias 150 and on the second contact surfaces of the conductive through vias TV. For example, the depths of the grinding marks on the first contact surfaces of the conductive vias 150 and on the second contact surfaces of the conductive through vias TV may range from 100 angstroms to 500 angstroms. In some embodiments, the width of the grinding mark is about 300 angstroms to about 1000 angstroms. For example, the width of the grinding mark is about 500 angstroms to about 800 angstroms.

During the grinding process of the insulating material 210, portions of the protection layer 160a are grinded to form a protection layer 160a'. In some embodiments, during the mechanical grinding process of the insulating material 210 and the protection layer 160a, portions of the conductive through vias TV are grinded also.

As shown in FIG. 8, the insulating encapsulation 210' encapsulates the sidewalls of the integrated circuit 200, and the insulating encapsulation 210' is penetrated by the conductive through vias TV. In other words, the integrated circuit 200 and the conductive through vias TV are embedded in the insulating encapsulation 210'. The conductive through vias TV may further include a plurality of third contact surfaces (e.g. the bottom surfaces) opposite to the second contact surface (e.g. the top surfaces). The insulating encapsulation 210' may include a first surface S1 and a second surface S2 opposite to the first surface S1. The first contact surfaces of the conductive vias 150 and the second contact surfaces of the conductive through vias TV are exposed at the first surface S1 of the insulating encapsulation 210', while the third contact surfaces of the conductive through vias TV are in contact with the dielectric layer DI. The first contact surfaces of the conductive vias 150 and the second contact surfaces of the conductive through vias TV are substantially coplanar with the first surface S1 of the insulating encapsulation 210'. The third contact surfaces of the conductive through vias TV are substantially coplanar with the second surface S2 of the insulating encapsulation 210'. It is noted that the contact surfaces of the conductive through vias TV, the first surface S1 (e.g., the top surface) of the insulating encapsulation 210', and the contact surfaces of the conductive vias 150 are substantially coplanar with the top surface of the protection layer 160a'.

It is noted that the insulating encapsulation 210' is formed by mechanical grinding, and no further chemical mechanical polishing (CMP) is required. Accordingly, the first contact surfaces of the conductive vias 150, the second contact surfaces of the conductive through vias TV, the first surface S1 of the insulating encapsulation 210', and the top surface of protection layer 160a' are rough enough for enhance the adhesion between the grinded surfaces and the sequentially formed layers.

the above-mentioned grinding marks are not only found on the first contact surfaces of the conductive vias 150 and on the second contact surfaces of the conductive through vias TV, but also found on the first surface S1 of the insulating encapsulation 210' and on the top surface of protection layer 160a'.

Figure 9:
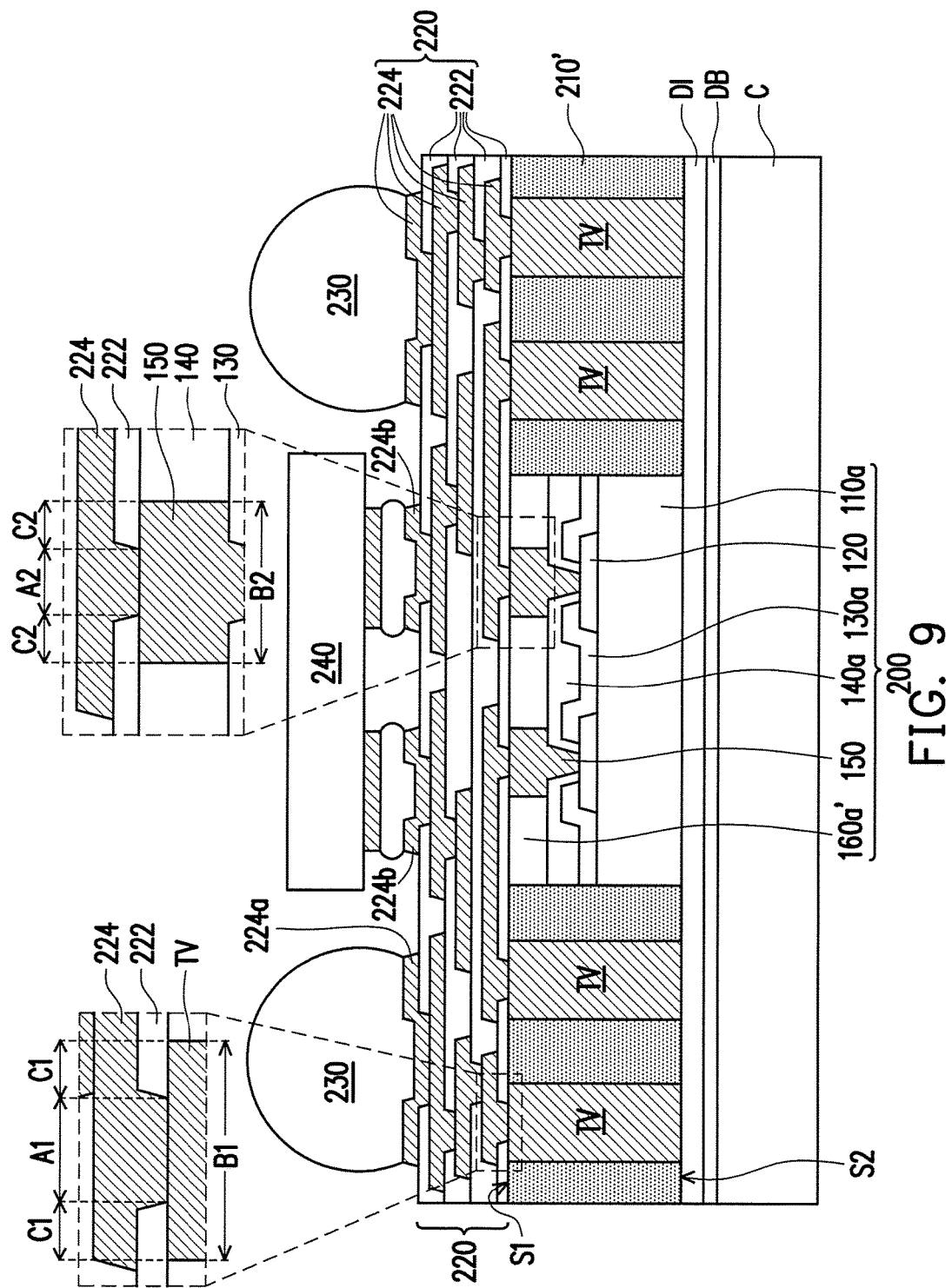

Referring to FIG. 9, after the insulating encapsulation 210' and the protection layer 160a' are formed, a redistribution circuit structure 220 electrically connected to the conductive pillars or conductive vias 150 of the integrated circuit 200 is formed on the first contact surfaces of the conductive through vias TV, the first surface S1 of the insulating encapsulation 210', the second contact surfaces of the conductive vias 150, and the top surface of the protection layer 160a'. The redistribution circuit structure 220 is fabricated to electrically connect with one or more connectors underneath. Here, the afore-said connectors may be the conductive pillars or conductive vias 150 of the integrated circuit 200 and/or be the conductive through vias TV embedded in the insulating encapsulation 210'. The redistribution circuit structure 220 is described in accompany with FIG. 9 in detail.

Referring to FIG. 9, the redistribution circuit structure 220 includes a plurality of inter-dielectric layers 222 and a plurality of redistribution conductive layers 224 stacked alternately, and the redistribution conductive layers 224 are electrically connected to the conductive vias 150 of the integrated circuit 200 and the conductive through vias TV embedded in the insulating encapsulation 210'. As shown in FIG. 9, in some embodiments, the first contact surfaces of the conductive vias 150 and the second contact surfaces of the conductive through vias TV are in contact with the redistribution circuit structure 220. The first contact surfaces of the conductive vias 150 and the second contact surfaces of the conductive through vias TV are partially covered by the bottommost inter-dielectric layer 222. Furthermore, the topmost redistribution conductive layer 224 includes a plurality of pads. In some embodiment the above-mentioned pads include a plurality of under-ball metallurgy (UBM) patterns 224a for ball mount and/or at least one connection pads 224b for mounting of passive components. The number of the under-ball metallurgy patterns 170 and the connection pad 172 is not limited in this disclosure.

Since the grinding marks are formed on the first contact surfaces of the conductive vias 150, the second contact surfaces of the conductive through vias TV, the first surface S1 of the insulating encapsulation 210', and the top surface of protection layer 160a', the adhesion between the above-mentioned grinded surfaces and the redistribution circuit structure 220 is enhanced. Accordingly, yield rate and reliability of the fabricated redistribution circuit structure 220 are improved.

Referring to the enlarged portions of FIG. 9, the bottommost inter-dielectric layer 222 may have a plurality of first contact openings for exposing the conductive through vias TV and a plurality of second contact openings for exposing the conductive vias 150, wherein the width A1 of the first contact opening for exposing the conductive through vias TV ranges from 10 micrometers to 50 micrometers, and the width A2 of the second contact opening for exposing the conductive vias 150 ranges from 10 micrometers to 20 micrometers. As shown in the enlarged portions of FIG. 9, the width B1 of the conductive through vias TV ranges from 60 micrometers to 250 micrometers, and the width B2 of the conductive vias 150 ranges from 50 micrometers to 100 micrometers. A width offset C1 (i.e. the first width offset C1) is between the width A1 and the width B1, and another width offset C2 (i.e. the second width offset C2) is between the width A2 and the width B2. The mis-alignment between the conductive through vias TV and the bottommost inter-dielectric layer 222 may be covered by the width offset C1, and the mis-alignment between the conductive vias 150 and the bottommost inter-dielectric layer 222 may be covered by the width offset C2. In some embodiments, the width offset C1 is greater than the width offset C2. For example, the width offset C1 ranges from 20 micrometers to 120 micrometers, and the width offset C2 ranges from 10 micrometers to 45 micrometers. In some alternative embodiments, a ratio of the width offset C1 and the width offset C2 may range from about 0.44 to about 12.

As shown in FIG. 9, after the redistribution circuit structure 220 is formed, a plurality of conductive balls 230 are placed on the under-ball metallurgy patterns 224a, and a plurality of passive components 240 are mounted on the connection pads 224b. In some embodiments, the conductive balls 230 may be placed on the under-ball metallurgy patterns 224a by ball placement process, and the passive components 240 may be mounted on the connection pads 240 through solder materials.

Referring to FIG. 9 and FIG. 10, after the conductive balls 230 and the passive components 240 are mounted on the redistribution circuit structure 220, the dielectric layer DI formed on the second surface S2 of the insulating encapsulation 210' is de-bonded from the de-bonding layer DB such the dielectric layer DI is separated from the carrier C. In some embodiments, the de-bonding layer DB (e.g., the LTHC release layer) may be irradiated by an UV laser such that the dielectric layer DI is peeled from the carrier C. As shown in FIG. 10, the dielectric layer DI is then patterned such that a plurality of contact openings O is formed to expose the third contact surfaces (i.e. the bottom surfaces) of the conductive through vias TV. The number of the contact openings O is corresponding to the number of the conductive through vias TV. In some embodiments, the contact openings O of the dielectric layer DI is formed by laser drilling process.

Referring to FIG. 11, after the contact openings O is formed in the dielectric layer DI, a plurality of conductive balls 250 are placed on the third contact surfaces of the conductive through vias TV that are exposed by the contact openings O. And, the conductive balls 250 are, for example, reflowed to bond with the third contact surfaces of the conductive through vias TV. As shown in FIG. 11, after the conductive balls 230 and the conductive balls 250 are formed, an integrated fan-out package of the integrated circuit 200 having dual-side terminals is accomplished.

Referring to FIG. 12, another package 300 is then provided. In some embodiments, the package 300 is, for example, a memory device. The package 300 is stacked over and is electrically connected to the integrated fan-out package illustrated in FIG. 11 through the conductive balls 250 such that a package-on-package (POP) structure is fabricated.

In the above-mentioned embodiments, fabrication costs of the integrated fan-out package are low. In addition, the integrated fan-out package has good reliability and yield rate.

In accordance with some embodiments of the present disclosure, an integrated fan-out package including an integrated circuit, an insulating encapsulation, a plurality of conductive through vias, and a redistribution circuit structure is provided. The integrated circuit includes a plurality of conductive terminals. The insulating encapsulation encapsulates sidewalls of the integrated circuit. The conductive through vias penetrate in the insulating encapsulation. The redistribution circuit structure is disposed on the integrated circuit, the conductive through vias and the insulating encapsulation. The redistribution circuit structure is electrically connected to the conductive terminals and the conductive through vias. A plurality of first contact surfaces of the conductive terminals and a plurality of second contact surfaces of the conductive through vias are in contact with the redistribution circuit structure, and a roughness of the first contact surfaces and the second contact surfaces ranges from 100 angstroms to 500 angstroms.

In accordance with alternative embodiments of the present disclosure, a method of fabricating an integrated fan-out package is provided. The method includes the following steps. A plurality of conductive through vias and an integrated circuit comprising a plurality of conductive terminals are provided. The conductive through vias, the conductive terminals, and a plurality of sidewalls of an integrated circuit are encapsulated with an insulating material. The insulating material is mechanically grinded to form an insulating encapsulation until a plurality of first contact surfaces of the conductive terminals and a plurality of second contact surfaces of the conductive through vias are exposed. A redistribution circuit structure is formed on the integrated circuit, the conductive through vias, and a first surface of the insulating encapsulation. The redistribution circuit structure is electrically connected to the conductive terminals and the conductive through vias.

In accordance with yet alternative embodiments of the present disclosure, another method of fabricating an integrated fan-out package is provided. The method includes the following steps. A carrier having a de-bonding layer and a dielectric layer disposed thereon is provided, wherein the de-bonding layer is between the carrier and the dielectric layer. An integrated circuit and a plurality of conductive through vias on the dielectric layer are provided on the dielectric layer, wherein the integrated circuit includes a plurality of conductive terminals. The conductive through vias, the conductive terminals, and a plurality of sidewalls of an integrated circuit are encapsulated with an insulating material. The insulating material is mechanically grinded to form an insulating encapsulation until a plurality of first contact surfaces of the conductive terminals and a plurality of second contact surfaces of the conductive through vias are exposed. A redistribution circuit structure is formed on the integrated circuit, the conductive through vias and a first surface of the insulating encapsulation, wherein the redistribution circuit structure is electrically connected to the conductive terminals and the conductive through vias. The carrier is de-bonded from the dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating an integrated fan-out package, the method comprising:
   providing a plurality of conductive through vias and an integrated circuit on a dielectric layer, the integrated circuit comprising a plurality of conductive terminals;
   encapsulating the conductive through vias, the conductive terminals and a plurality of sidewalls of an integrated circuit with an insulating material;
   performing a mechanical grinding process to mechanically grind the insulating material to form an insulating encapsulation until a plurality of first contact surfaces of the conductive terminals and a plurality of second contact surfaces of the conductive through vias are exposed, wherein the mechanical grinding process is not followed by a chemical mechanical polishing process, such that after performing the mechanical grinding process, roughness of the first contact surfaces and the second contact surfaces ranges from 100 angstroms to 500 angstroms;
   forming a redistribution circuit structure on the integrated circuit, the conductive through vias, and a first surface of the insulating encapsulation, wherein the redistribution circuit structure is electrically connected to the conductive terminals and the conductive through vias; and forming a plurality of contact openings in the dielectric layer after forming the insulating encapsulation, wherein the—plurality of contact openings expose a plurality of third contact surfaces of the conductive through vias encapsulated by the insulating encapsulation.

2. The method of claim 1, wherein a plurality of grinding marks are formed on the first contact surfaces and the second contact surfaces after the first contact surfaces and the second contact surfaces are grinded, and depths of the grinding marks range from 100 angstroms to 500 angstroms.

3. The method of claim 1, wherein the plurality of second contact surfaces of the conductive through vias are opposite to the plurality of third contact surfaces of the conductive through vias.

4. A method of fabricating an integrated fan-out package, the method comprising:
providing a carrier having a de-bonding layer and a dielectric layer disposed thereon, the de-bonding layer being between the carrier and the dielectric layer;
providing an integrated circuit on the dielectric layer, and the integrated circuit comprising a plurality of conductive terminals;
providing a plurality of conductive through vias on the dielectric layer;
encapsulating the conductive through vias, the conductive terminals and a plurality of sidewalls of an integrated circuit with an insulating material;
performing a mechanical grinding process to mechanically grind the insulating material to form an insulating encapsulation until a plurality of first contact surfaces of the conductive terminals and a plurality of second contact surfaces of the conductive through vias are exposed, wherein the mechanical grinding process is not followed by a chemical mechanical polishing process, such that after performing the mechanical grinding process, a roughness of the first contact surfaces and the second contact surfaces ranges from 100 angstroms to 500 angstroms;
forming a redistribution circuit structure on the integrated circuit, the conductive through vias and a first surface of the insulating encapsulation, wherein the redistribution circuit structure is electrically connected to the conductive terminals and the conductive through vias;
de-bonding the carrier from the dielectric layer; and
forming a plurality of contact openings in the dielectric layer after de-bonding the carrier from the dielectric layer such that the—plurality of contact openings expose a plurality of third contact surfaces of the conductive through vias encapsulated by the insulating encapsulation.

5. The method of claim 4, wherein the first contact surfaces of the conductive terminals and the second contact surfaces of the conductive through vias are formed by the mechanical grinding process only.

6. The method of claim 4, wherein the integrated circuit is provided on the dielectric layer before the conductive through vias are provided on the dielectric layer.

7. The method of claim 4, wherein the integrated circuit is provided on the dielectric layer after the conductive through vias are provided on the dielectric layer.

8. The method of claim 4, wherein a plurality of grinding marks are formed on the first contact surfaces and the second contact surfaces after the first contact surfaces and the second contact surfaces are grinded, and depths of the grinding marks range from 100 angstroms to 500 angstroms.

9. The method of claim 4, wherein the plurality of second contact surfaces of the conductive through vias are opposite to the plurality of third contact surfaces of the conductive through vias.

10. The method of claim 4, wherein the roughness of the first contact surfaces and the second contact surfaces ranges from 250 angstroms to 400 angstroms.

11. The method of claim 4, wherein the roughness of the first contact surfaces and the second contact surfaces ranges from 250 angstroms to 400 angstroms.

12. The method of claim 4, wherein the first contact surfaces of the conductive terminals and the second contact surfaces of the conductive through vias are formed by the mechanical grinding process only.

13. A method of fabricating an integrated fan-out package, the method comprising:
providing a carrier;
forming a dielectric layer on the carrier;
providing an integrated circuit on the dielectric layer carried by the carrier, and the integrated circuit comprising a plurality of conductive terminals;
providing a plurality of conductive through vias on the dielectric layer carried by the carrier;
forming an insulating material to encapsulate the conductive through vias, the conductive terminals and a plurality of sidewalls of an integrated circuit;
performing a mechanical grinding process to mechanically grind the insulating material to form an insulating encapsulation until a plurality of first contact surfaces of the conductive terminals and a plurality of second contact surfaces of the conductive through vias are exposed, wherein the insulating encapsulation comprises a first surface substantially coplanar with the first contact surfaces and the second contact surfaces;
forming a redistribution circuit structure on the integrated circuit, the conductive through vias and the first surface of the insulating encapsulation, roughness of the first contact surfaces of the conductive terminals formed by only the mechanical grinding process ranging from 100 angstroms to 500 angstroms, roughness of the second contact surfaces of the conductive through vias formed by only the mechanical grinding process ranging from 100 angstroms to 500 angstroms;
de-bonding the carrier from the integrated circuit encapsulated by the insulating encapsulation; and
forming a plurality of contact openings in the dielectric layer after de-bonding the carrier from the integrated circuit encapsulated by the insulating encapsulation such that the—plurality of contact openings expose a plurality of third contact surfaces of the conductive through vias encapsulated by the insulating encapsulation.

14. The method of claim 13, wherein the redistribution circuit structure is in contact with the first contact surfaces of the conductive terminals and the second contact surfaces of the conductive through vias formed by the mechanical grinding process only.

15. The method of claim 13, wherein the mechanical grinding process is not followed by a chemical mechanical polishing process.

16. The method of claim 13, wherein a plurality of grinding marks are formed on the first contact surfaces and the second contact surfaces after the first contact surfaces and the second contact surfaces are grinded, and depths of the grinding marks range from 100 angstroms to 500 angstroms.

17. The method of claim 13, wherein the plurality of second contact surfaces of the conductive through vias are opposite to the plurality of third contact surfaces of the conductive through vias.

18. The method of claim 13, wherein the integrated circuit is provided on the dielectric layer carried by the carrier before the conductive through vias are provided on the dielectric layer.

19. The method of claim 13, wherein the integrated circuit is provided on the dielectric layer carried by the carrier after the conductive through vias are provided on the dielectric layer.

20. The method of claim 13, wherein the roughness of the first contact surfaces and the second contact surfaces ranges from 250 angstroms to 400 angstroms.

* * * * *